United States Patent
van Gaasbeek et al.

(10) Patent No.: US 7,888,655 B2
(45) Date of Patent: Feb. 15, 2011

(54) TRANSFER MECHANISM FOR TRANSFERRING A SPECIMEN

(75) Inventors: Erik Pieter van Gaasbeek, Borculo (NL); Pleun Dona, Veldhoven (NL); Gerbert Jeroen van de Water, Deil (NL); Johannes Antonius Maria van den Oetelaar, Eindhoven (NL); Paul Johannes Leonardes Barends, Oisterwijk (NL); Ian Johannes Bernardus van Hees, Zaltbommel (NL)

(73) Assignee: FEI Company, Hillsboro, OR (US)

( * ) Notice: Subject to any disclaimer, the term of this patent is extended or adjusted under 35 U.S.C. 154(b) by 431 days.

(21) Appl. No.: 11/881,031

(22) Filed: Jul. 25, 2007

(65) Prior Publication Data

US 2008/0283768 A1  Nov. 20, 2008

(30) Foreign Application Priority Data

Jul. 26, 2006  (EP) .................................. 06117867

(51) Int. Cl.
*G21K 5/10* (2006.01)

(52) U.S. Cl. ..................... 250/442.11; 850/8; 850/16; 850/18

(58) Field of Classification Search ............ 250/442.11; 850/8, 16, 18
See application file for complete search history.

(56) References Cited

U.S. PATENT DOCUMENTS

| 5,001,350 | A | | 3/1991 | Ohi et al. |
|---|---|---|---|---|
| 5,225,683 | A | * | 7/1993 | Suzuki et al. .......... 250/442.11 |
| 5,270,552 | A | | 12/1993 | Ohnishi et al. |
| 5,986,270 | A | | 11/1999 | Bormans et al. |
| 6,164,448 | A | * | 12/2000 | Schmutz et al. ............. 206/488 |
| 6,188,072 | B1 | | 2/2001 | Chung |

(Continued)

FOREIGN PATENT DOCUMENTS

JP  8055814  2/1996

(Continued)

OTHER PUBLICATIONS

Potter, et al: "Robotic Grid Loading System for a Transmission Electron Microscope", Journal of Structural Biology, No. 146, 2004, pp. 431-440.

*Primary Examiner*—Bernard E Souw
*Assistant Examiner*—Michael J Logie
(74) *Attorney, Agent, or Firm*—Scheinberg & Griner, LLP; Michael O. Scheinberg; David Griner

(57) ABSTRACT

The invention relates to a transfer mechanism for transferring a specimen (2) from a first position in a first holder (40) to a second position in a second holder (10) and/or vice versa, each holder (10, 40) equipped to detachably hold the specimen, the transfer of the specimen between the holders taking place in a transfer position different from the second position, characterized in that when the specimen is transferred between the holders (10, 40) a mechanical guidance mechanism positions the holders with a mutual accuracy higher than the mutual accuracy in the second position, and said mechanical guidance mechanism not positioning at least one of the holders (10, 40) when the specimen is in the second position. The mechanical guidance mechanism may comprise extra parts (50). At least one of the holders (40) may be equipped to hold a multitude of specimens.

20 Claims, 3 Drawing Sheets

U.S. PATENT DOCUMENTS

Figure 1:
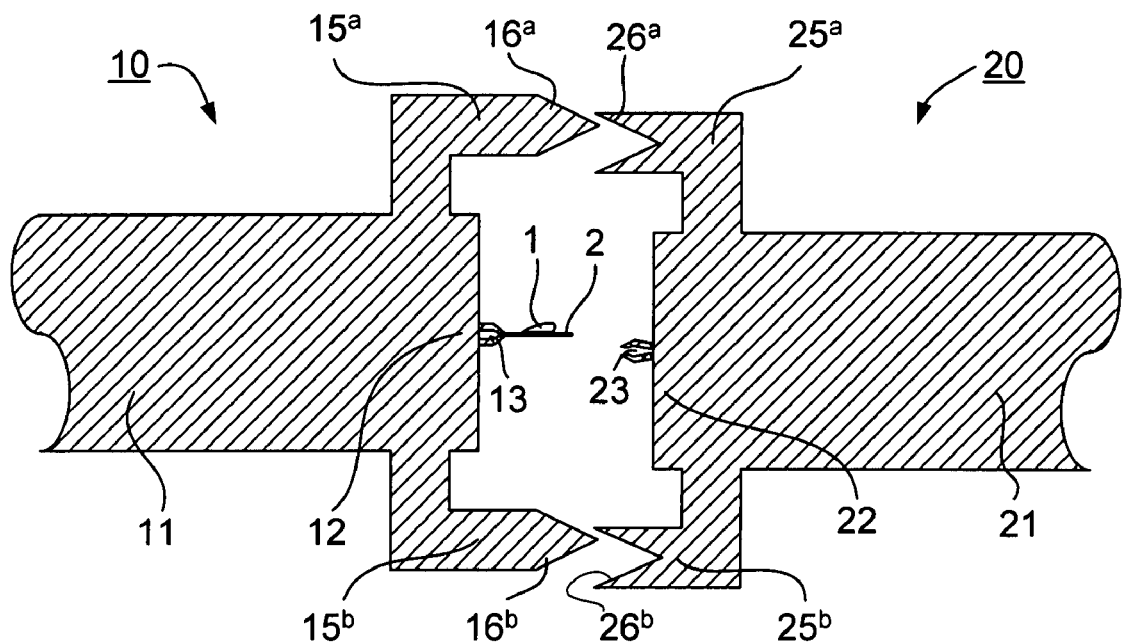

| | | |
|---|---|---|
| 6,570,170 B2 | 5/2003 | Moore |
| 6,717,156 B2 * | 4/2004 | Sugaya et al. ........... 250/440.11 |
| 6,858,851 B2 * | 2/2005 | Tomimatsu et al. .... 250/442.11 |
| 6,927,391 B2 | 8/2005 | Tokuda et al. |
| 6,963,068 B2 | 11/2005 | Asselbergs et al. |
| 6,967,335 B1 | 11/2005 | Dyer et al. |
| 7,005,636 B2 | 2/2006 | Tappel |
| 7,227,140 B2 * | 6/2007 | Skidmore et al. ........... 250/307 |
| 7,238,953 B2 | 7/2007 | Zandbergen |
| 7,375,325 B2 * | 5/2008 | Burkhardt et al. ........... 250/307 |
| 7,381,971 B2 * | 6/2008 | Moore et al. ........... 250/442.11 |
| 7,414,252 B2 | 8/2008 | Moore et al. |
| 7,420,184 B2 | 9/2008 | van de Water et al. |
| 7,550,750 B2 * | 6/2009 | Tokuda et al. ........... 250/492.21 |
| 2003/0088966 A1 * | 5/2003 | Ehrfeld et al. ................. 29/592 |
| 2005/0035302 A1 * | 2/2005 | Morrison ............... 250/442.11 |
| 2005/0107917 A1 * | 5/2005 | Smith et al. .................. 700/245 |
| 2006/0219919 A1 * | 10/2006 | Moore et al. ................. 250/311 |

FOREIGN PATENT DOCUMENTS

| | | |
|---|---|---|
| JP | 2005-294181 | 10/2005 |

* cited by examiner

TRANSFER MECHANISM FOR TRANSFERRING A SPECIMEN

The invention relates to a transfer mechanism for transferring a specimen from a first position in a first holder to a second position in a second holder and/or vice versa, each holder equipped to detachably hold the specimen, the transfer of the specimen between the holders taking place in a transfer position different from the second position.

Such a transfer mechanism is known from "Robotic grid loading system for a transmission electron microscope", C. S. Potter et al., J. Struct. Biol. 146(3), June 2004, pages 431-440.

Such transfer mechanisms are in use as part of or in conjunction with e.g. particle-optical instruments. Such particle-optical instruments are used for the inspection and/or analysis of specimens, e.g. specimens taken out of a wafer during the manufacturing process of the wafer, or e.g. biological tissues.

The known transfer mechanism works in conjunction with a Transmission Electron Microscope (TEM), where it enables automatic loading and unloading of specimens in the microscope.

As known to the person skilled in the art, specimens to be inspected in a TEM must be extremely thin. A typical thickness of less than 100 nm, more preferably less than 50 nm is used. To handle such a thin specimen the specimen is often mounted on a specimen carrier comprising e.g. a mesh, the mesh supporting the specimen. The most widely used specimen carriers have a diameter of 3 mm and a thickness between appr. 10 and 25 µm. Obviously these specimen carriers are quite fragile.

The known transfer mechanism comprises a grid tray workstation and a robotic arm equipped with a gripper.

The robotic arm is a 6-axis articulate arm with a reach of 665 mm and a repeatability of positioning of +/−20 µm. On the robotic arm a multi-force/torque sensor is mounted, on which a grid gripper is mounted.

The grid tray workstation accepts a grid tray, said tray containing up to 96 specimen carriers held in depressions. The tray is precisely positioned using registration holes.

The known transfer mechanism further comprises a specimen holder workstation, which accepts a specimen holder for the TEM. A pin on the specimen holder precisely registers the specimen holder in the specimen holder workstation. A pneumatic vice holds the specimen holder firmly in place.

The specimen holder is of a type that accepts a grid in a cut-out and holds the grid with a spring-loaded lever. The specimen holder workstation has provisions to operate the lever.

Operation of the known transfer system comprises positioning the grid gripper to a specific grid in the grid tray, gripping the grid, transporting the grid to the specimen holder and inserting the grid in the cut-out of the specimen holder.

To enable the grid gripper to pick up a grid the gripper must be very well positioned with respect to the grid: the grid is very fragile and gripping the grid in a mis-aligned position could easily result in damaged grids. This is the reason for the high positional repeatability of the robot of +/−20 µm.

The known transfer mechanism also has provisions to insert the specimen holder in the TEM.

It is remarked that a positional accuracy of 20 µm over a reach of e.g. 665 mm, as used in the known transfer mechanism, corresponds to e.g. an angular accuracy of 30 µrad, which requires a very sophisticated and stable guidance mechanism. A transfer mechanism equipped with a robot with the before mentioned accuracy and reach is therefore very expensive. Also, the resulting transfer mechanism is, due to these demands, voluminous and heavy, which makes this transfer mechanism unsuited to be mounted on e.g. a TEM. The known transfer mechanism is therefore mounted separate from the TEM. This, however, introduces extra problems when interfacing the transfer mechanism with the TEM, as their mutual position is not well defined.

The invention aims to provide a smaller, lighter and less expensive transfer mechanism than the known transfer mechanism.

To that end the invention is characterized in that, when the specimen is transferred between the holders, a mechanical guidance mechanism positions the holders with a mutual accuracy higher than the mutual accuracy in the second position, and said mechanical guidance mechanism not positioning at least one of the holders when the specimen is in the second position.

The invention is based on the insight that during transfer both holders contact the specimen simultaneously. Due to the fragility of the specimen the positional accuracy between the holders must then be high. However, the high positional accuracy need not be maintained when the specimen can only be contacted by one holder.

Positioning the two holders at one specific position with an accuracy of e.g. 20 µm (as achieved in the known transfer mechanism) is relatively easily achieved with a compact and light mechanical guidance mechanism, e.g. equipping the two holders with cooperating parts, that form the guidance mechanism when the two holders are pushed together.

In an embodiment of the transfer mechanism according to the invention the mechanical guidance mechanism is formed by the cooperation of the shape of the holders.

By e.g. equipping the two holders with cooperating parts which form the guidance mechanism, and guide the two holders when the two holders are pushed together, a simple and reliable mechanical guidance mechanism is created.

In another embodiment of the transfer mechanism according to the invention the mechanical guidance mechanism is formed by the cooperation of the two holders with a separate member, said member detachably contacted by both holders when the specimen is transferred.

In this embodiment the two holders cooperate with a separate member. This separate member can guide the holders when they are pushed against the member, but the separate member can also clamp the holders in a specific position, after which the specimen can be transferred.

An additional advantage is that, when the separate member is positioned with respect to an apparatus, such as a camera, the position of the holders with respect to that apparatus is also well defined during transfer, enabling e.g. monitoring of the transfer.

In yet another embodiment of the transfer mechanism according to the invention at least one holder is equipped to hold a multitude of specimens.

When one of the holders is equipped to hold a multitude of specimens, this multitude of specimens can be automatically processed, e.g. by automatic inspection in a TEM.

In yet another embodiment of the transfer mechanism according to the invention the transfer mechanism is equipped to operate in a vacuum environment.

In still yet another embodiment of the transfer mechanism according to the invention mutual accuracy of the holders during the transfer of the specimen must be less than 50 µm in any direction.

The invention will now be elucidated with figures, in which corresponding reference numerals indicate corresponding features. To that end:

FIG. 1 schematically depicts a cross-section of the transfer mechanism according to the invention, in which the geometry of the holders forms the mechanical guidance system.

Figure 2:
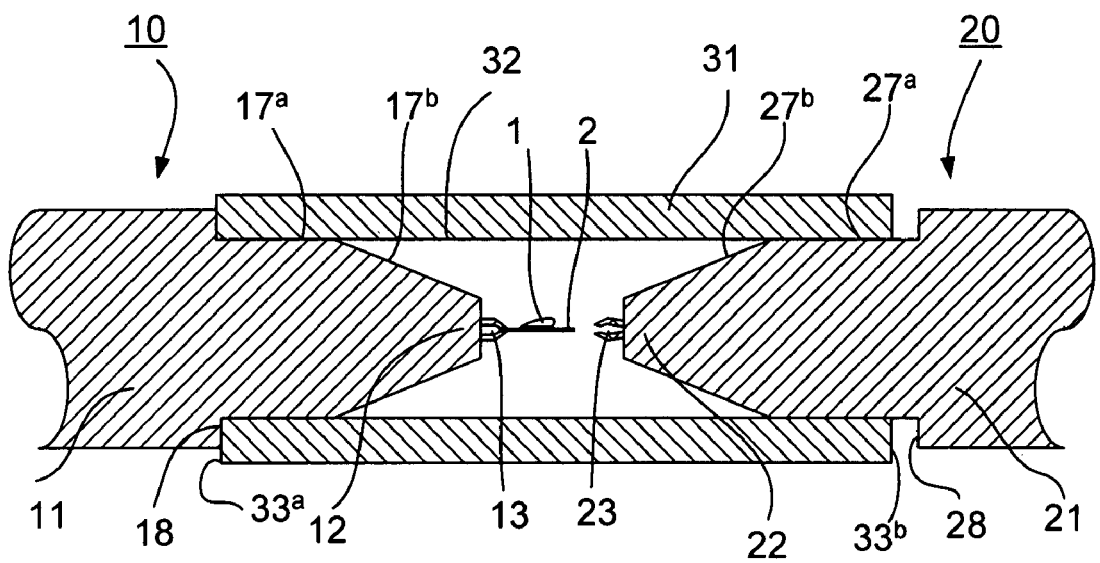

FIG. 2 schematically depicts a cross-section of the transfer mechanism according to the invention, in which the holders cooperate with a separate member to form the mechanical guidance system.

Figure 3:
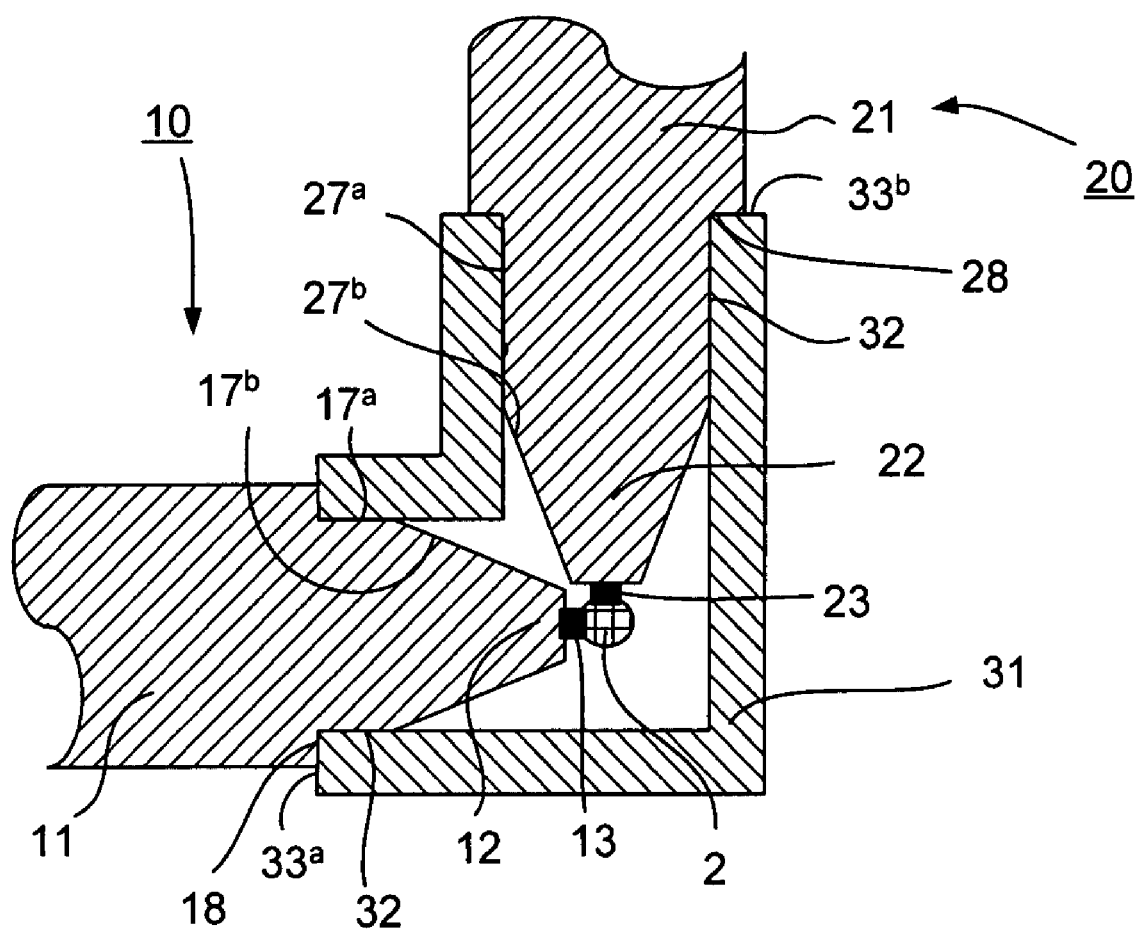

FIG. 3 schematically depicts a cross-section of the transfer mechanism according to the invention, in which the specimen is transferred between two axles moving perpendicular to each other.

Figure 4:
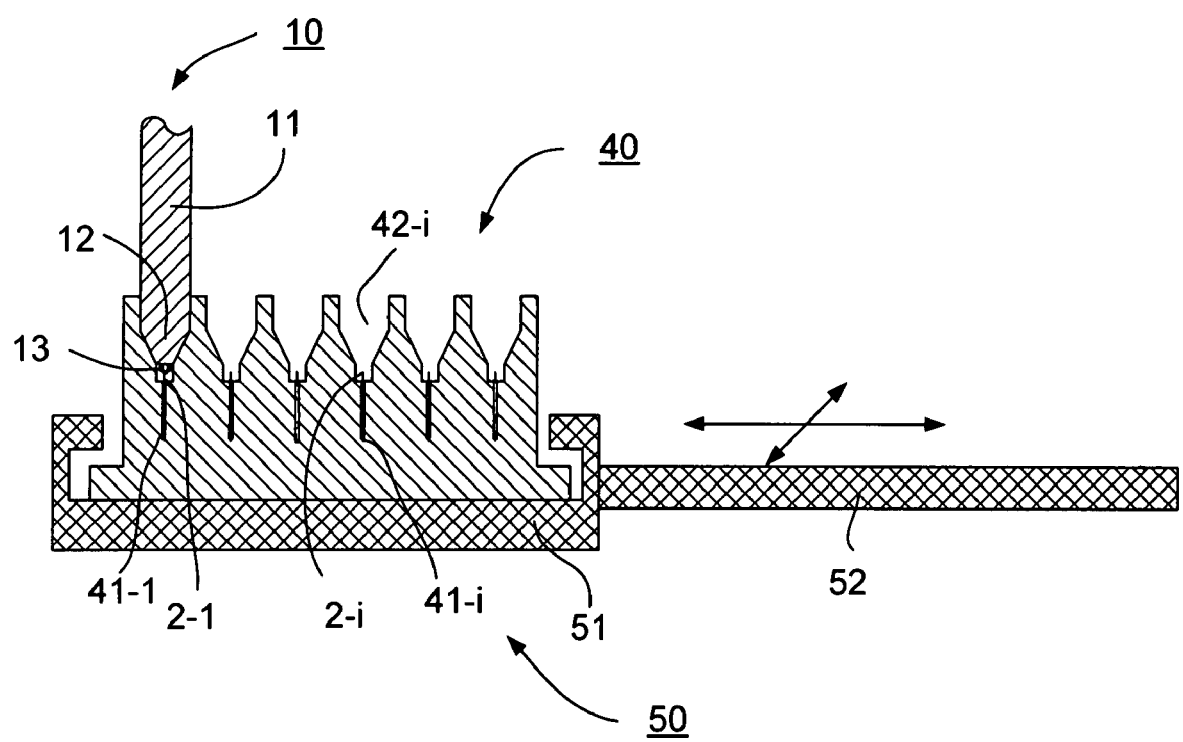

FIG. 4 schematically depicts a cross-section of the transfer mechanism according to the invention, in which one of the holders is equipped to hold a multitude of specimens.

FIG. 1 shows schematically a cross-section of the transfer mechanism according to the invention, in which the geometry of the holders forms the mechanical guidance system.

The specimen 1 is mounted on a TEM specimen grid 2 in a fashion known to the person skilled in the art.

A first holder 10 comprises an axle 11 with an extremity 12. Extremity 12 is equipped with a gripper 13. Such a gripper is commercially available, e.g. the Zyvex NanoEffector™ Microgripper model BB series from Zyvex Corporation. Holder 10 is further equipped with two extremity $15^a$ and $15^b$, which show convex surfaces $16^a$ and $16^b$.

Likewise the second holder 20 comprises an axle 21 with an extremity 22. Extremity 22 is equipped with a gripper 23. The second holder 20 is further equipped with two extremities $25^a$ and $25^b$, which show concave surfaces $26^a$ and $26^b$ intended to cooperate with the convex surfaces $16^a$ and $16^b$ of extremities $15^a$ and $15^b$.

When moving the two holders 10 and 20 towards each other the two cooperating surfaces $16^a$ and $26^a$ of extremities $15^a$ and $25^a$, and the two cooperating surfaces $16^b$ and $26^b$ of extremities $15^b$ and $25^b$ will align the two axles 11 and 21 and thereby position the grippers 13 and 23 relative to each other with a much higher accuracy than when the features $15^a$, $15^b$, $25^a$ and $25^b$ would not be present.

Assuming that the specimen carrier is gripped by gripper 13, and gripper 23 is open (as shown), the high positional accuracy achieved guarantees that the other gripper 23 does not touch the specimen carrier. The specimen carrier 2, and thus the specimen 1, can now be transferred from gripper 13 to the other gripper 23 by closing gripper 23 and then opening gripper 13. The second holder 20 can then be retracted to another position, thereby transferring the specimen from a first position to a second position.

It is remarked that for the transfer mechanism according to the invention to work properly, at least one of the axles must show a certain amount of play, so that the axles can position with respect to each other.

It is further remarked that grippers of other models or types than the one referred to before can be used. Grippers based on e.g. piezo-effect, electrostatic force or magnetic force are known to work, as well as grippers based on mechanical movement caused by e.g. electric motors.

It is also remarked that, although this embodiment discusses a specimen mounted on a TEM grid, which may be inspected in a TEM, the invention also relates to other specimens or specimen carriers and that the transfer mechanism can also interface with e.g. a Scanning Electron Microscope (SEM), a Focused Ion Beam instrument (FIB) or with e.g. an instrument that uses both ion and electron beams. Also instruments using transfer mechanisms for other purposes may interface with or be equipped with the transfer mechanism described.

FIG. 2 shows schematically a cross-section of the transfer mechanism according to the invention, in which the holders cooperate with a separate member to form the mechanical guidance system.

The specimen 1 is mounted on a TEM specimen grid 2 in a fashion known to the person skilled in the art.

Separate member 31 shows an inner surface 32 and end-faces $33^a$ and $33^b$. A first holder 10 comprises an axle 11 with an extremity 12. Extremity 12 is equipped with a gripper 13. The surface $17^a$, $17^b$ of extremity 12 is formed to cooperate with the inner surface 32 of the separate member 31, while end-face 18 is formed to cooperate with end-face $33^a$ of the separate member 31. A second holder 20 comprises an axle 21 with an extremity 22. Extremity 22 is equipped with a gripper 23. The surface $27^a$, $27^b$ of extremity 22 is formed to cooperate with the inner surface 32 of the separate member 31, while end-face 28 is formed to cooperate with end-face $33^b$ of the separate member 31.

When the two holder 10 and 20 are moved towards each other, they are first centred by surfaces $17^b$ and $27^b$ contacting the inner surface 32 of the separate member. After that the surfaces $17^a$ and $27^a$, contacting the inner surface 32 of the separate member 31, also align the two holders with respect to each other. The distance between the grippers is dictated by faces 18 and $33^a$ respectively 28 and $33^b$ contacting each other.

It is remarked that separate member 31 can be a section of a round tube, but can also be a section of a tube with e.g. a rectangular cross-section. In the latter case also the rotational degree of freedom of the holders along their common axis is prescribed.

It is further remarked that separate member 31 can be connected to a part of the apparatus of which the transfer mechanism is part, but no high positional demands of this separate member with respect to the holders or with respect to the apparatus are needed: as long as surfaces $17^b$ and $27^b$ can enter the separate member, after which surfaces $17^a$ and $27^a$ will contact inner surface 32 of the separate member, the two holders will be positioned correctly for transfer.

It is also remarked that separate member 31 need not be one part: it can also be equipped as e.g. two parts movable with respect to each other, clamping around the two holders when closing.

FIG. 3 schematically depicts a cross-section of the transfer mechanism according to the invention, in which the specimen is transferred between two axles moving perpendicular to each other.

FIG. 3 can be thought to be derived from FIG. 2. The end-face $33^b$ and that part of the inner surface 32 which dictate the position of holder 20 when that holder is inserted in the separate member 31 are now turned at right angles with respect to the end-face $33^a$ nd that part of the inner surface dictating the position of holder 10.

It will be clear to the person skilled in the art that grippers 13 and 23 are viewed at another angle than in FIG. 2, and that the sample carrier 2 is thus depicted at another angle as well.

It is remarked that the axles need not be in-line (as shown in FIG. 2) or perpendicular (as shown in FIG. 3), but that a transfer mechanism with an arbitrary angle between the axles can be constructed.

FIG. 4 schematically depicts a cross-section a cross-section of the transfer mechanism according to the invention, in which one of the holders is equipped to hold a multitude of specimens.

Holder 10 comprises an axle 11 with an extremity 12. Extremity 12 is equipped with a gripper 13.

Cassette 40 is a holder for specimen carriers comprises a plurality of slots 41-*i* in which a plurality of specimen carriers 1-*i* may be placed. Each of the slots 41-*i* connect to a cone-like recess 42-*i*. The surfaces of the cone-like recesses 42-*i* are intended to cooperate with the surface of extremity 12 in such a way that, when extremity 12 is inserted fully into one of the recesses 42-*i*, the gripper mounted on axle 11 is precisely positioned with respect to slot 41-*i*, and thus with specimen carrier 1-*i*.

Cassette 40 is loosely connected to a cassette manipulator 50, thereby giving cassette 40 play to position itself with respect to holder 10 when extremity 12 of holder 10 is inserted in cassette 40. Cassette manipulator 50 comprises a body 51 in which cassette 40 is mounted, and an axle 52 to position body 51 with respect to holder 10.

The axle 52 of the cassette manipulator 50 can position cassette 40 with sufficient accuracy so that holder 10 can be inserted into a specific recess 42-*i*. The accurate positioning of the gripper 13 with respect to the recess 42-*i* is accomplished by the cooperating surfaces of extremity 12 and recess 42-*i*. Thus a specific specimen carrier 2-*i* can be picked out of cassette 40.

It is remarked that by preference cassette 40 is detachably mounted in cassette manipulator 50, so that the cassette can be exchanged by another cassette. It is further remarked that it is not necessary that both holders are movable. Especially when using a cassette it is conceivable that the cassette is kept stationary.

We claim as follows:

1. Transfer mechanism for transferring a specimen from a first position in a first holder to a second position in a second holder, each holder equipped to detachably hold the specimen wherein at least one of the holders includes a gripper for gripping the specimen by moving from an open position to a closed position and releasing the specimen by moving from a closed position to an open position, the transfer of the specimen between the holders taking place in a transfer position different from the second position, characterized in that when the specimen is transferred between the holders a mechanical guidance mechanism positions the holders with a mutual positional accuracy higher than the positional accuracy of the second holder in the second position, and said mechanical guidance mechanism not positioning at least one of the holders when the specimen is in the second position.

2. Transfer mechanism according to claim 1 in which the mechanical guidance mechanism is formed by the cooperation of the shape of the holders.

3. Transfer mechanism according to claim 1 in which the mechanical guidance mechanism is formed by the cooperation of the two holders with a separate member, said member detachably contacted by both holders when the specimen is transferred.

4. Transfer mechanism according to claim 1 in which at least one of the first and second holders is equipped to hold a multitude of specimens.

5. Transfer mechanism according to claim 1 in which the transfer mechanism is equipped to operate in a vacuum environment.

6. Transfer mechanism according to claim 1 in which the mutual positional accuracy of the holders during the transfer of the specimen must be less than 50 µm in any direction.

7. Apparatus equipped with a transfer mechanism according to claim 1.

8. Apparatus according to claim 7 in which the apparatus is a particle-optical apparatus.

9. A transfer mechanism for transferring a microscopic specimen from a first holder to a second holder, the mechanism comprising:
a first specimen holder for holding a specimen;
a second, moveable specimen holder having a first positional accuracy and including a releasable gripper for gripping the specimen by moving from an open position to a closed position and releasing the specimen by moving from a closed position to an open position; and
a mechanical guide to align the first holder and the second holder at a transfer position, the mechanical guide providing a relative positional accuracy between the first specimen holder and the second specimen holder greater than the first positional accuracy.

10. The transfer mechanism of claim 9 further comprising a drive for moving the second, moveable specimen holder from the transfer position to a second position, the mechanical guide not guiding the second, moveable specimen holder at the second position.

11. The transfer mechanism of claim 9 in which the mechanical guide is formed by the cooperation of a structure of the first specimen holder and a complementary structure of the second specimen holder.

12. The transfer mechanism of claim 9 in which the mechanical guide is formed by the cooperation of the two specimen holders with a separate member, said member detachably contacted by both specimen holders when the specimen is transferred.

13. The transfer mechanism of claim 9 in which at least one of the first and second specimen holders is equipped to hold a multitude of specimens.

14. The transfer mechanism of claim 9 in which at least one of the first and second specimen holders is equipped to hold a TEM specimen grid.

15. A method of transferring a microscopic specimen, comprising:
providing a first specimen holder holding a specimen;
providing a mechanical guide, the position of the mechanical guide being determined by the position of the first specimen holder;
providing a second, moveable specimen holder including a gripper for gripping the specimen;
guiding a second specimen holder using the mechanical guide into a position proximate to the first specimen holder;
gripping the specimen using the gripper of the second specimen holder, wherein the gripper of the second specimen holder moves from an open position to a closed position;
releasing the specimen from the first specimen holder;
moving the second, moveable specimen holder with the specimen to a second position,
the mechanical guide, being positioned by the first specimen holder, allowing alignment between the specimen holders with greater precision than the positional precision capability of the second specimen holder without the mechanical guide.

16. The method of claim 15 in which:
moving the second, moveable specimen holder with the specimen to a second position including moving the second, moveable specimen holder with a first positionable accuracy; and
guiding a second specimen holder using the mechanical guide into a position proximate to the first specimen holder includes guiding the second specimen holder with an accuracy greater than the first positional accuracy.

17. The method of claim 15 in which guiding a second specimen holder using the mechanical guide into a position proximate to the first specimen holder includes guiding the second specimen holder using a complementary structure connected to each of the first specimen holder and the second specimen holder.

18. The method of claim 15 in which guiding a second specimen holder using the mechanical guide into a position proximate to the first specimen holder includes guiding the second specimen holder using a separate member detachably contacted by the first specimen holder and the second specimen holder.

19. The method of claim 15 in which gripping the specimen using the gripper of the second specimen holder includes gripping a TEM grid and in which releasing the specimen from the first specimen holder includes releasing a TEM grid.

20. The method of claim 15 in which moving the second, moveable specimen holder with the specimen to a second position includes moving the second specimen holder to insert the specimen into a TEM.

* * * * *